US010444297B2

(12) United States Patent
Kao

(10) Patent No.: US 10,444,297 B2
(45) Date of Patent: Oct. 15, 2019

(54) ELECTRONIC SYSTEM AND METHOD FOR RECOGNIZING STATUS OF POWER-SUPPLY DEVICE

(71) Applicant: GIGA-BYTE TECHNOLOGY CO., LTD., New Taipei (TW)

(72) Inventor: Chin-Jun Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 91 days.

(21) Appl. No.: 15/696,133

(22) Filed: Sep. 5, 2017

(65) Prior Publication Data

US 2018/0356469 A1    Dec. 13, 2018

(30) Foreign Application Priority Data

Jun. 9, 2017  (TW) .............................. 106119195 A

(51) Int. Cl.
    *G01R 31/40*        (2014.01)
(52) U.S. Cl.
    CPC .................... *G01R 31/40* (2013.01)
(58) Field of Classification Search
    CPC ....................................................... G01R 31/40
    USPC ...................................... 324/764.01; 702/58
    See application file for complete search history.

(56) References Cited

U.S. PATENT DOCUMENTS

| | | | |
|---|---|---|---|
| 4,535,410 A * | 8/1985 | O'Mara | H02H 3/243 340/663 |
| 5,530,879 A | 6/1996 | Crump et al. | |
| 6,760,846 B1 | 7/2004 | Yoshida et al. | |
| 7,002,265 B2 | 2/2006 | Potega | |
| 7,487,391 B2 | 2/2009 | Pecone et al. | |
| 2016/0006344 A1* | 1/2016 | Hayashi | H02M 3/33561 307/31 |

OTHER PUBLICATIONS

Office Action of Taiwan Counterpart Application, dated Jun. 13, 2018, pp. 1-4.

* cited by examiner

*Primary Examiner* — Farhana A Hoque
(74) *Attorney, Agent, or Firm* — JCIPRNET

(57) ABSTRACT

An electronic system and a method for recognizing status of a power-supply device are provided. The electronic system includes a power-supply device and an electronic device. The power-supply device generates a working power and stores an accumulated operation time length and a suggested operation time length of the power-supply device. The electronic device is coupled to the power-supply device and receives the working power to perform a booting operation. The electronic device reads the accumulated operation time length and the suggested operation time length from the power-supply device and compares the accumulated operation time length and the suggested operation time length. If the accumulated operation time length is greater than or equal to the suggested operation time length, the electronic device generates a warning message to indicate that the power-supply device has reached a life time.

10 Claims, 3 Drawing Sheets

ELECTRONIC SYSTEM AND METHOD FOR RECOGNIZING STATUS OF POWER-SUPPLY DEVICE

CROSS-REFERENCE TO RELATED APPLICATION

This application claims the priority benefit of Taiwan application serial no. 106119195, filed on Jun. 9, 2017. The entirety of the above-mentioned patent application is hereby incorporated by reference herein and made a part of this specification.

BACKGROUND OF THE INVENTION

Field of the Invention

The invention relates to an electronic system, and particularly relates to an electronic system and a method for recognizing status of a power-supply device.

Description of Related Art

Generally, modern electrical equipment adopts a power-supply device (for example, an adaptor) to serve as a main source of electricity. Along with a long time usage of the power-supply device, components or wires inside the power-supply device are probably aged. However, a general user cannot clearly know whether the power-supply device is aged. In case that the components or wires inside the power-supply device are aged, once the power-supply device is overloaded, the power-supply device probably has an excessive temperature to cause a risk. Besides, different power-supply devices probably provide different output voltages, output currents or output powers, and if the output voltage, the output current or the output power provided by the power-supply device are inconsistent with the power requirements of the electrical equipment, the electrical equipment may not operate stably or a service life of the electrical equipment is shortened, or even the electrical equipment is burned. Therefore, how to get to learn a status and a specification of the power-supply device to improve security and reliability of the electrical equipment in usage is a target to be achieved by related technicians.

SUMMARY OF THE INVENTION

The invention is directed to an electronic system and a method for recognizing status of a power-supply device, so as to improve security and reliability of electrical equipment.

The invention provides an electronic system for recognizing a status of a power-supply device including the power-supply device and an electronic device. The power-supply device generates a working power and stores an accumulated operation time length and a suggested operation time length of the power-supply device. The electronic device is coupled to the power-supply device and receives the working power to perform a booting operation. The electronic device reads the accumulated operation time length and the suggested operation time length from the power-supply device and compares the accumulated operation time length and the suggested operation time length. If the accumulated operation time length is greater than or equal to the suggested operation time length, the electronic device generates a warning message to indicate that the power-supply device has reached a life time.

In an embodiment of the invention, if the accumulated operation time length is greater than or equal to the suggested operation time length, the electronic device further stops the booting operation, and determines whether to continue the booting operation according to an input instruction.

In an embodiment of the invention, if the accumulated operation time length is smaller than the suggested operation time length, the electronic device determines that the power-supply device does not reach the life time, and continues the booting operation to complete the booting operation.

In an embodiment of the invention, when the electronic device performs the booting operation, the electronic device further stores a booting time point to the power-supply device. The electronic device reads the booting time point and the accumulated operation time length during a shutdown operation, and calculates a usage time length according to the booting time point and a shutdown time point, and updates the accumulated operation time length in the power-supply device according to a sum of the usage time length and the accumulated operation time length.

The invention provides a method for recognizing status of a power-supply device including following steps. A working power is provided to an electronic device by the power-supply device to perform a booting operation. An accumulated operation time length and a suggested operation time length of the power-supply device are read by the electronic device. It is determined whether the accumulated operation time length is greater than or equal to the suggested operation time length by the electronic device to obtain a determination result. If the determination result is affirmative, a warning message is generated by the electronic device to indicate that the power-supply device has reached a life time.

In an embodiment of the invention, the method for recognizing status of the power-supply device further includes following steps. The electronic device stops the booting operation when the determination result is affirmative, and determines whether to continue the booting operation according to an input instruction.

In an embodiment of the invention, the method for recognizing status of the power-supply device further includes following steps. The electronic device determines that the power-supply device does not reach the life time when the determination result is negative, and continues the booting operation to complete the booting operation.

In an embodiment of the invention, the method for recognizing status of the power-supply device further includes following steps. A booting time point is stored to the power-supply device by the electronic device during the booting operation. The booting time point and the accumulated operation time length are read by the electronic device during a shutdown operation, and a usage time length is calculated by the electronic device according to the booting time point and a shutdown time point. The accumulated operation time length of the power-supply device is updated by the electronic device according to a sum of the usage time length and the accumulated operation time length.

According to the above description, the invention provides an electronic system and a method for recognizing status of a power-supply device, where the electronic device reads the accumulated operation time length and the suggested operation time length of the power-supply device. When the electronic device determines that the accumulated operation time length is greater than or equal to the suggested operation time length, the electronic device generates a warning message to indicate that the power-supply device has reached the life time, so as to serve as a reference for replacing the power-supply device. Since the electronic device is adapted to recognize a current usage status of the power-supply device, usage security and reliability of the electronic device are improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
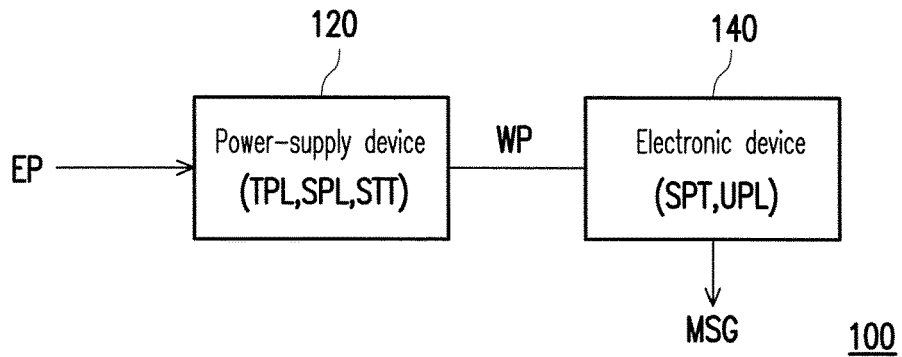
FIG. 1 is a block diagram of an electronic system for recognizing a status of a power-supply device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, FIG. 1 is a block diagram of an electronic system for recognizing a status of a power-supply device according to an embodiment of the invention. The electronic system 100 includes a power-supply device 120 and an electronic device 140. The power-supply device 120 is configured to converting an external power EP so as to generate a working power WP. In an embodiment of the invention, the power-supply device 120 may be an adaptor, the external power EP may be an alternating current (AC) power or a direct current (DC) power, and the working power WP may be a DC power, though the invention is not limited thereto. Moreover, the power-supply device 120 stores an accumulated operation time length TPL and a suggested operation time length SPL of the power-supply device 120, where the accumulated operation time length TPL is an accumulated time length that the power-supply device 120 has been used to supply power after leaving the factory, and the suggested operation time length SPL is a longest accumulated usage time length of the power-supply device 120 recommended by the manufacturer.

The electronic device 140 is coupled to the power-supply device 120, and receives the working power WP to perform a booting operation. Particularly, the electronic device 140 may read the accumulated operation time length TPL and the suggested operation time length SPL from the power-supply device 120 during the booting operation, and compares the accumulated operation time length TPL and the suggested operation time length SPL. If the electronic device 140 determines that the accumulated operation time length TPL is greater than or equal to the suggested operation time length SPL, the electronic device 140 may generate a warning message MSG to indicate that the power-supply device 120 has reached a life time. In this way, a user may get to learn a status of the power-supply device 120 according to the warning message MSG, and takes the status as a reference to determine whether to replace the power-supply device 120.

In an embodiment of the invention, if the electronic device 140 determines that the accumulated operation time length TPL is greater than or equal to the suggested operation time length SPL, the electronic device 140 may stop the booting operation, and the electronic device 140 may determine whether to continue the booting operation according to an input instruction of the user. If the user decides not to replace the power-supply device 120 yet, the user may input the input instruction to make the electronic device 140 to continue the booting operation, such that the electronic device 140 may normally work after completing the booting operation. Comparatively, if the user decides to replace the power-supply device 120, the user may input the input instruction to make the electronic device 140 to stop performing the booting operation, and now the electronic device 140 is shut down.

In an embodiment of the invention, if the accumulated operation time length TPL is smaller than the suggested operation time length SPL, the electronic device 140 may determine that the power-supply device 120 does not reach the life time, such that the electronic device 140 continues the booting operation, and normally works after completing the booting operation.

In an embodiment of the invention, the electronic device 140 may store a booting time point STT of the electronic device 140 to the power-supply device 120 during the booting operation. It is understandable that the booting time point STT is a time point that the power-supply device 120 starts to supply power. Moreover, the electronic device 140 may read the booting time point STT of a present operation and the accumulated operation time length TPL of the power-supply device 120 during a shutdown operation. The electronic device 140 may calculate a usage time length UPL of the power-supply device 120 (i.e. a time length that the power-supply device 120 supplies power) in the present operation according to the booting time point STT and a shutdown time point SPT (i.e. a time point when the power-supply device 120 stops supplying power) of the present operation. The electronic device 140 may update the accumulated operation time length TPL of the power-supply device 120 according to a sum of the usage time length UPL and the accumulated operation time length TPL. In this way, the accumulated operation time length TPL stored in the power-supply device 120 may truly reflect an accumulated time length the that power-supply device 120 has supplied power.

In an embodiment of the invention, the electronic device 140 is, for example, electrical equipment such as a personal computer (PC), a personal digital assistant (PDA), a notebook computer, a tablet PC, a smart phone, a digital music player or a display, etc., though the invention is not limited thereto.

Figure 2:
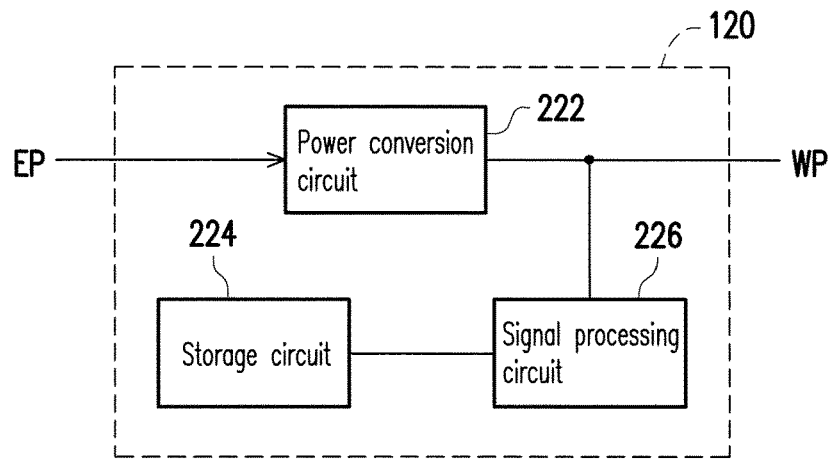
FIG. 2 is a block schematic diagram of the power-supply device of FIG. 1.

Referring to FIG. 1 and FIG. 2, FIG. 2 is a block schematic diagram of the power-supply device 120 of FIG. 1. The power-supply device 120 may include a power conversion circuit 222, a storage circuit 224 and a signal processing circuit 226. The power conversion circuit 222 is configured to perform a power conversion to the external power EP so as to generate the working power WP. The storage circuit 224 is configured to store a plurality of first status information, where the first status information may include the accumulated operation time length TPL and the suggested operation time length SPL of the power-supply device 120 and the booting time point STT of the electronic device 140.

The signal processing circuit 226 is coupled to the power conversion circuit 222 and the storage circuit 224. The signal processing circuit 226 may extract a read instruction or a write instruction provided by the electronic device 140 from the working power WP. The signal processing circuit 226 may combine the corresponding first status information in the storage circuit 224 with the working power WP for transmitting to the electronic device 140 in response to the read instruction; alternatively, the signal processing circuit 226 may update the corresponding first status information in the storage circuit 224 in response to the write instruction.

For example, if the aforementioned read instruction represents that the electronic device 140 wants to read the accumulated operation time length TPL of the power-supply device 120, the signal processing circuit 226 may combine the accumulated operation time length TPL stored in the storage circuit 224 with the working power WP for transmitting to the electronic device 140. If the aforementioned write instruction represents that the electronic device 140 wants to update the accumulated operation time length TPL of the power-supply device 120, the signal processing circuit 226 may update the accumulated operation time length TPL stored in the storage circuit 224 by using update information in the write instruction.

In an embodiment of the invention, the storage circuit 224 is further configured to store a plurality of second status information, where the second status information may include at least one of a manufacturer identification code, a product model, a manufacturing date, an output voltage, a maximum output current, a minimum working current and a certification number of the power-supply device 120, though the invention is not limited thereto.

In an embodiment of the invention, the electronic device 140 may read at least one of the aforementioned second status information during the booting operation to accordingly determine whether the power-supply device 120 is matched to the electronic device 140. If it is determined that the power-supply device 120 and the electronic device 140 are not matched (for example, the output voltage or the maximum output current of the power-supply device 120 is not complied with the requirement of the electronic device 140), the electronic device 140 may generate the warning message MSG to serve as a reference for replacing the power-supply device 120.

In another embodiment of the invention, the electronic device 140 may read at least one of the aforementioned second status information during the booting operation to accordingly determine whether the power-supply device 120 is a certified power-supply device. If the power-supply device 120 is an uncertified power-supply device (for example, the power-supply device 120 does not store the certification number), the electronic device 140 may generate the warning message MSG to serve as a reference for replacing the power-supply device 120.

In an embodiment of the invention the power conversion circuit 222 may be implemented by a known power conversion circuit, the storage circuit 224 may be implemented by a non-volatile memory circuit, and the signal processing circuit 226 may be implemented by a known signal superimposition/separation circuit.

Figure 3:
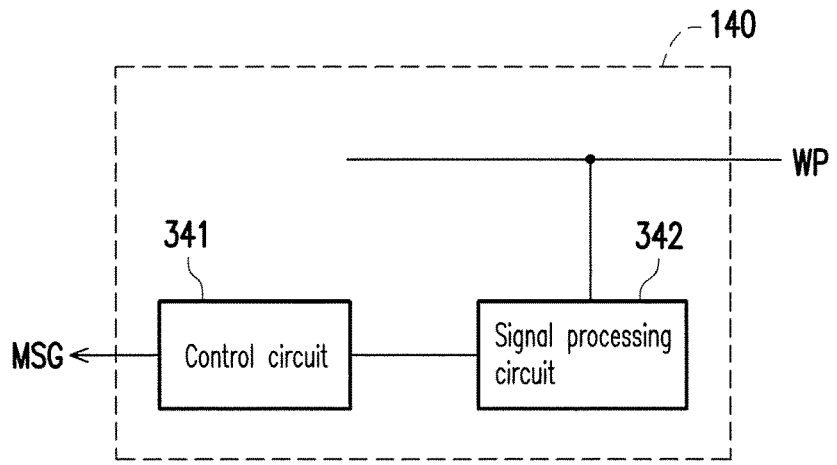
FIG. 3 is a block schematic diagram of an electronic device of FIG. 1.

Referring to FIG. 1 and FIG. 3, FIG. 3 is a block schematic diagram of the electronic device 140 of FIG. 1. The electronic device 140 includes a control circuit 341 and a signal processing circuit 342, though the invention is not limited thereto. The control circuit 341 serves as a control core of the electronic device 140 to control various operations of the electronic device 140. In detail, the control circuit 341 may generate at least one of the read instruction and the write instruction during the booting operation or the shutdown operation of the electronic device 140. On the other hand, the signal processing circuit 342 is coupled to the control circuit 341. The signal processing circuit 342 may combine the aforementioned read instruction with the working power WP for transmitting to the power-supply device 120, and may obtain at least one of a plurality of first status information stored in the power-supply device 120 from the working power WP based on the read instruction, where the first status information may include the accumulated operation time length TPL, the suggested operation time length SPL and the booting time point STT. Alternatively, the signal processing circuit 342 may combine the aforementioned write instruction with the working power WP for transmitting to the power-supply device 120, so as to update at least one corresponding first status information stored in the power-supply device 120.

For example, the control circuit 341 may generate a first read instruction during the booting operation, where the first read instruction is used for reading the accumulated operation time length TPL and the suggested operation time length SPL of the power-supply device 120. The signal processing circuit 342 may combine the first read instruction with the working power WP for transmitting to the power-supply device 120. The power-supply device 120 may combine the accumulated operation time length TPL and the suggested operation time length SPL with the working power WP for transmitting back to the electronic device 140 in response to the first read instruction. In this way, the signal processing circuit 342 may extract the accumulated operation time length TPL and the suggested operation time length SPL from the working power WP. Then, the control circuit 341 may compare the accumulated operation time length TPL with the suggested operation time length SPL, and if the accumulated operation time length TPL is greater than or equal to the suggested operation time length SPL, the control circuit 341 generates the warning message MSG.

Moreover, the control circuit 341 may generate a first write instruction during the booting operation, where the first write instruction is used for storing the booting time point STT of the electronic device 140 to the power-supply device 120. The signal processing circuit 342 may combine the aforementioned first write instruction with the working power WP for transmitting to the power-supply device 120, such that the booting time point STT is stored to the power-supply device 120.

Moreover, the control circuit 341 may generate a second read instruction during the shutdown operation, where the second read instruction is used for reading the booting time point STT and the accumulated operation time length TPL stored in the power-supply device 120. The signal processing circuit 342 may combine the second read instruction with the working power WP for transmitting to the power-supply device 120. The power-supply device 120 may combine the booting time point STT and the accumulated operation time length TPL with the working power WP for transmitting back to the electronic device 140 in response to the second read instruction. In this way, the signal processing circuit 342 may extract the booting time point STT and the accumulated operation time length TPL from the working power WP. Then, the control circuit 341 may calculate a usage time length UPL according to the obtained booting time point STT and the shutdown time point SPT of the shutdown operation. Then, the control circuit 341 may generate the second write instruction, where the second write instruction is used for updating the accumulated operation time length TPL in the power-supply device 120 by using a sum of the usage time length UPL and the accumulated operation time length TPL. Therefore, the signal processing circuit 342 may combine the second write instruction with the working power WP for transmitting to the power-supply device 120, such that the power-supply device 120 updates the accumulated operation time length TPL based on the sum of the usage time length UPL and the accumulated operation time length TPL.

In an embodiment of the invention, the control circuit 341 may be hardware, firmware, or software or machine-executable program codes stored in a memory and adapted to be loaded and executed by a micro-processor or a digital signal processor. In case that the control circuit 341 is implemented by hardware, the control circuit 341 may be implemented by a single integrated circuit chip, or a plurality of circuit chips, which is not limited by the invention. The circuit chips or the single integrated circuit chip may be implemented by an application specific integrated circuit (ASIC) or a field programmable gate array (FPGA). The aforementioned memory is, for example, a random access memory, a read-only memory or a flash memory, etc. In an embodiment of the invention, the signal processing circuit 342 may be implemented by a known signal superimposition/separation circuit.

Figure 4:
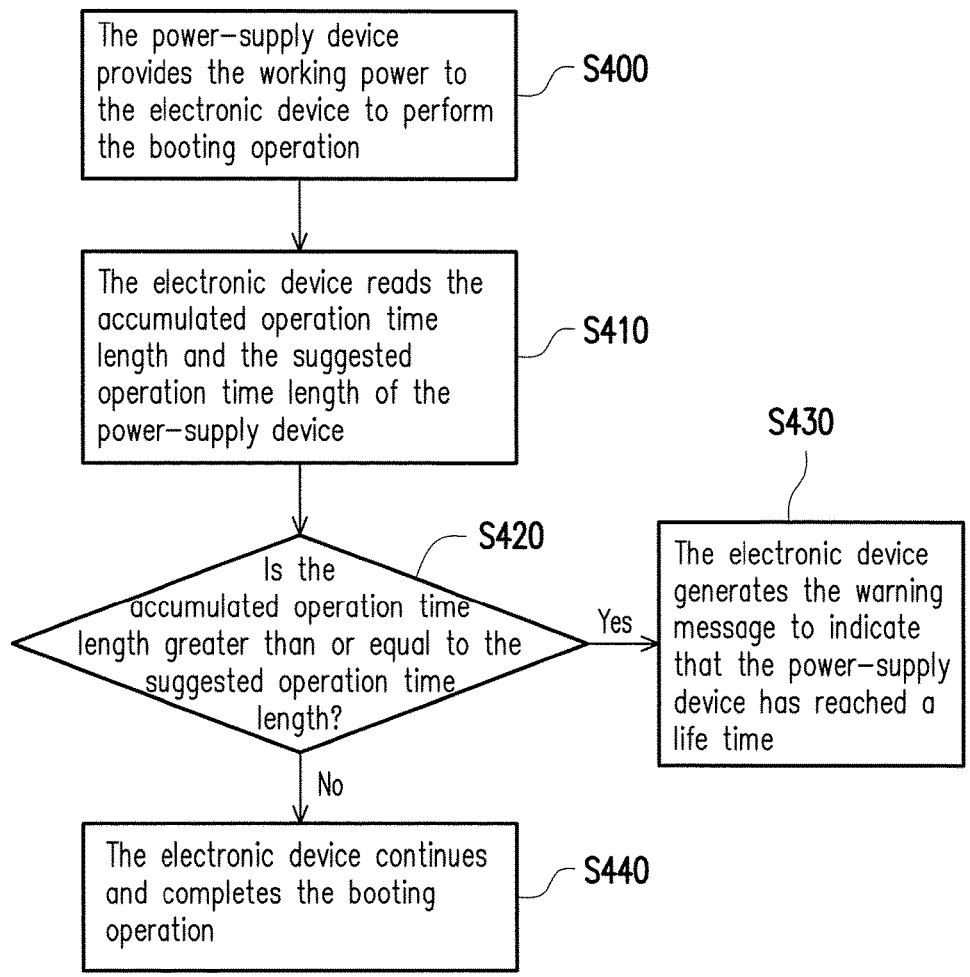
FIG. 4 is a flowchart illustrating a method for recognizing status of a power-supply device according to an embodiment of the invention.

FIG. 4 is a flowchart illustrating a method for recognizing status of a power-supply device according to an embodiment of the invention. Referring to FIG. 1 and FIG. 4, in step S400, the power-supply device 120 provides the working power WP to the electronic device 140, and the electronic device 140 performs the booting operation. Then, in step S410, the electronic device 140 reads the accumulated operation time length TPL and the suggested operation time length SPL of the power-supply device 120. Then, in step S420, the electronic device 140 determines whether the accumulated operation time length TPL is greater than or equal to the suggested operation time length SPL to obtain a determination result. If the determination result of the step S420 is affirmative, in step S430, the electronic device 140 generates the warning message MSG to indicate that the power-supply device 120 has reached a life time. If the determination result of the step S420 is negative, it represents that the power-supply device 120 does not reach the life time, and the electronic device 140 may continue and complete the booting operation, as shown in step S440.

Figure 5:
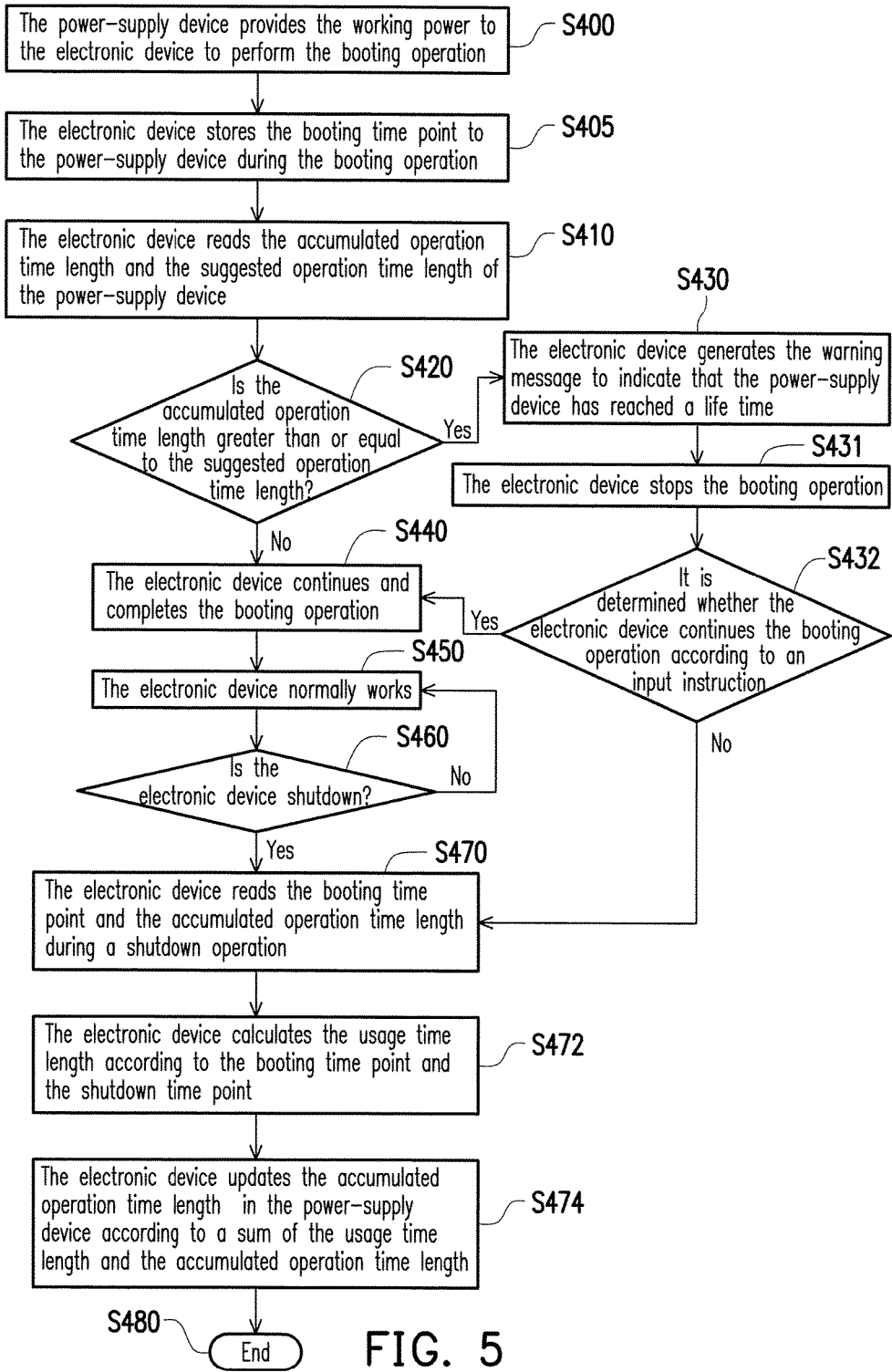
FIG. 5 is a flowchart illustrating a method for recognizing status of a power-supply device according to another embodiment of the invention.

FIG. 5 is a flowchart illustrating a method for recognizing status of a power-supply device according to another embodiment of the invention. Referring to FIG. 1 and FIG. 5, steps S400, S410, S420, S430 and S440 of FIG. 5 are similar to the steps S400, S410, S420, S430 and S440 of FIG. 4, so that related description of FIG. 4 can be referred for description of the steps of FIG. 5, and details thereof are not repeated.

Between the step S400 and the step S410 of FIG. 5, as shown in a step S405, the electronic device 140 stores the booting time point STT to the power-supply device 120 during the booting operation. Moreover, after the step S430, i.e. after the warning message MSG is generated, the electronic device 140 may stop the booting operation, and a user may provide an input instruction to determine whether the electronic device 140 continues the booting operation, as shown in a step S431 and a step S432. If the input instruction is to instruct the electronic device 140 to continue the booting operation, in step S440, the electronic device 140 completes the booting operation, and normally works in step S450.

After the step S450, it is determined whether the electronic device 140 is to be shutdown, as shown in step S460. If a determination result of the step S460 is negative, the process returns back to the step S450, and the electronic device 140 normally works. If the determination result of the step S460 is affirmative, a step S470 is executed, by which the electronic device 140 reads the booting time point STT and the accumulated operation time length TPL during the shutdown operation. Then, in step S472, the electronic device 140 calculates the usage time length UPL according to the booting time point STT and the shutdown time point SPT. Then, in step S474, the electronic device 140 updates the accumulated operation time length TPL in the power-supply device 120 according to a sum of the usage time length UPL and the accumulated operation time length TPL. Then, the flow for recognizing the status of the power-supply device is ended, as shown in step S480.

Comparatively, in the step S432, if the input instruction is not to instruct the electronic device 140 to continue the booting operation, the aforementioned step S470, the step S472 and the step S474 are sequentially executed to update the accumulated operation time length TPL in the power-supply device 120, and finally in the step S480, the shutdown operation is completed to end the flow for recognizing the status of the power-supply device.

In summary, the invention provides an electronic system and a method for recognizing status of a power-supply device, where the electronic device may read the accumulated operation time length and the suggested operation time length of the power-supply device. When the electronic device determines that the accumulated operation time length is greater than or equal to the suggested operation time length, the electronic device generates a warning message to indicate that the power-supply device has reached the life time, so as to serve as a reference for replacing the power-supply device. Moreover, the electronic device may read other status information (for example, the second status information of the above embodiment) of the power-supply device to determine whether the power-supply device is matched to the electronic device, or determine whether the power-supply device is a certified power supply-device. In this way, usage security and reliability of the electronic device are improved.

It will be apparent to those skilled in the art that various modifications and variations may be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic system for recognizing status of a power-supply device, comprising:
   the power-supply device, generating a working power and storing an accumulated operation time length and a suggested operation time length of the power-supply device; and
   an electronic device, coupled to the power-supply device, and receiving the working power to perform a booting operation, wherein the electronic device reads the accumulated operation time length and the suggested operation time length, and compares the accumulated operation time length and the suggested operation time length, and if the accumulated operation time length is greater than or equal to the suggested operation time length, the electronic device generates a warning message to indicate that the power-supply device has reached a life time,
wherein when the electronic device performs the booting operation, the electronic device further stores a booting time point to the power-supply device, and
the electronic device reads the booting time point and the accumulated operation time length during a shutdown operation, calculates a usage time length according to the booting time point and a shutdown time point, and updates the accumulated operation time length in the power-supply device according to a sum of the usage time length and the accumulated operation time length,
wherein the electronic device comprises:
a control circuit, configured to generate at least one of a read instruction and a write instruction during the booting operation or the shutdown operation; and
a first signal processing circuit, coupled to the control circuit,
wherein the first signal processing circuit combines the read instruction with the working power for transmitting to the power-supply device, and obtains at least one of the first status information stored in the power-supply device form the working power based on the read instruction, wherein the first status information comprises the accumulated operation time length, the suggested operation time length and the booting time point,
wherein the first signal processing circuit combines the write instruction with the working power for transmitting to the power-supply device, so as to update at least one of the first status information stored in the power-supply device.

2. The electronic system for recognizing status of the power-supply device as claimed in claim 1, wherein if the accumulated operation time length is greater than or equal to the suggested operation time length, the electronic device further stops the booting operation, and determines whether to continue the booting operation according to an input instruction.

3. The electronic system for recognizing status of the power-supply device as claimed in claim 1, wherein if the accumulated operation time length is smaller than the suggested operation time length, the electronic device determines that the power-supply device does not reach the life time, and continues the booting operation to complete the booting operation.

4. The electronic system for recognizing status of the power-supply device as claimed in claim 1, wherein the power-supply device comprises:
a power conversion circuit, configured to convert an external power to generate the working power;
a storage circuit, configured to store the plurality of first status information; and
a second signal processing circuit, coupled to the power conversion circuit and the storage circuit, and configured to extract the read instruction or the write instruction provided by the electronic device from the working power,
wherein the second signal processing circuit combines at least one of the first status information with the working power for transmitting to the electronic device in response to the read instruction,
wherein the second signal processing circuit updates at least one of the first status information in response to the write instruction.

5. The electronic system for recognizing status of the power-supply device as claimed in claim 4, wherein the storage circuit is further configured to store a plurality of second status information, wherein the second status information compares at least one of a manufacturer identification code, a product model, a manufacturing date, an output voltage, a maximum output current, a minimum working current and a certification number of the power-supply device.

6. The electronic system for recognizing status of the power-supply device as claimed in claim 5, wherein the electronic device further reads at least one of the second status information during the booting operation, and accordingly determines whether the power-supply device is matched with the electronic device, and generates the warning message when a determination result is negative.

7. The electronic system for recognizing status of the power-supply device as claimed in claim 5, wherein the electronic device further reads at least one of the second status information during the booting operation, and accordingly determines whether the power-supply device is a certified power-supply device, and generates the warning message when a determination result is negative.

8. A method for recognizing status of a power-supply device, comprising:
providing a working power to an electronic device by the power-supply device to perform a booting operation;
storing a booting time point to the power-supply device by a control circuit of the electronic device during the booting operation;
reading an accumulated operation time length and a suggested operation time length of the power-supply device by the control circuit;
determining whether the accumulated operation time length is greater than or equal to the suggested operation time length by the control circuit to obtain a determination result;
generating a warning message by the control circuit to indicate that the power-supply device has reached a life time when the determination result is affirmative;
reading the booting time point and the accumulated operation time length by the control circuit during a shutdown operation;
calculating a usage time length by the control circuit according to the booting time point and a shutdown time point; and
updating the accumulated operation time length of the power-supply device by the control circuit according to a sum of the usage time length and the accumulated operation time length.

9. The method for recognizing status of the power-supply device as claimed in claim 8, further comprising:
stopping the booting operation by the control circuit when the determination result is affirmative, and determining whether to continue the booting operation according to an input instruction.

10. The method for recognizing status of the power-supply device as claimed in claim 8, further comprising:
determining that the power-supply device does not reach the life time by the control circuit when the determination result is negative, and continuing the booting operation to complete the booting operation.

* * * * *